United States Patent [19]

Morito

[11] Patent Number: 4,573,178

[45] Date of Patent: Feb. 25, 1986

[54] COUNTER EMPLOYING FEEDBACK SHIFT REGISTER CONTROLLING HYSTERESIS CIRCUIT

[75] Inventor: Hiroshi Morito, Tokyo, Japan

[73] Assignee: Nippon Electric Co., Ltd., Tokyo, Japan

[21] Appl. No.: 756,566

[22] Filed: Jul. 18, 1985

Related U.S. Application Data

[63] Continuation of Ser. No. 378,851, May 17, 1982.

[30] Foreign Application Priority Data

May 18, 1981 [JP] Japan ................................. 56-74403

[51] Int. Cl.⁴ .......................................... H03K 25/12
[52] U.S. Cl. ...................................... 377/97; 377/47; 377/72; 377/75
[58] Field of Search ...................... 377/47, 48, 54, 56, 377/108, 114, 64, 70, 72, 75, 77, 97

[56] References Cited

U.S. PATENT DOCUMENTS 2,846,670  8/1958  Torrey ................................. 377/97
4,348,597  9/1982  Weber ................................. 377/72

Primary Examiner—John S. Heyman
Assistant Examiner—Karl Ohralic
Attorney, Agent, or Firm—Laff, Whitesel, Conte & Saret

[57] ABSTRACT

A counter for counting pulses or dividing frequencies has a timing signal generator circuit for generating a timing signal at a predetermined interval. A hysteresis circuit has input-output characteristics defining a low input threshold level and a high input threshold level. A control circuit responds to the timing signal for generating at least three control signals having different levels including a first control signal having a level lower than the low input threshold level, a second control signal having a level higher than the high input threshold level, and a third control signal having an intermediate level which is between the low input threshold level and the high input threshold level. The counter has a very large capacity, simple construction, and is effective with both analog and digital signals.

8 Claims, 17 Drawing Figures

COUNTER EMPLOYING FEEDBACK SHIFT REGISTER CONTROLLING HYSTERESIS CIRCUIT

This is a continuation of Ser. No. 06/378,851, filed May 17, 1982.

This invention relates to counters and more particularly to counters that are suitable for pulse counting or frequency division.

A counter is one of the circuit elements which is required both in the field of digital signal processing and in the field of analog signal processing. Heretofore the most essential portion of a counter, is the portion where counting operations or frequency-dividing operations are carried out, which has been constructed of a group of cascaded flip-flops or a shift register. With regard to a control system for a counter, various systems have been proposed such as a ripple carry system in which an output signal from one flip-flop is applied to an input of the succeeding flip-flop, or a synchronous system in which a train of clock pulses is applied in common to all flip-flops. However, whatever system may be employed, each counter used the technical concept of making use of a flip-flop group or a shift register as a basic circuit for counting operations or frequency-dividing operations.

In such a counter in the prior art, the maximum countable value or the maximum frequency-division ratio is determined by the number of the cascaded flip-flops or by the number of stages of the shift register. Accordingly, in the case where a large count value or a large frequency-division ratio is required, the number of the flip-flops or the number of stages of the shift register had to be increased. This was a big obstacle against a reduction in size and cost of a counter. Moreover, when the number of stages in the flip-flop group or shift register is increased, the total sum of the delay time between an input and an output of an individual flip-flop or shift register stage becomes large. Hence, there was a shortcoming because a great error is introduced in the count value or the frequency-division ratio. Furthermore, operating speed is adversely affected by the stray capacitance that is parasitic to the wiring for coupling the respective flip-flops or shift register stages. Thus, the accuracy of the counting operation or frequency-dividing operation would be further degraded.

On the other hand, recently counters have been described for use in analog signal processing, such as those employing a charge transfer device such as a CCD (Charge Coupled Device) or a BBD (Bucket Brigade Device). These have been used as analog shift registers. In such an analog shift register, an inverted output signal is fed back to the input end by providing an inverter between the output portion and the input portion of the shift register. In this type of counter, the basic counting operation or frequency-dividing operation also makes use of the charge transfer device. Accordingly, in order to realize a large count value or a large frequency division ratio, the number of cells in the charge transfer device must be increased. However, a CCD or a BBD having a large numer of cells is very expensive, and it cannot be handled in a simple manner as a general-purpose counter. In addition, in a large-sized charge transfer device, a transmission delay time also involves a big problem. Therefore, despite the extremely large demand for realizing such a large analog processing count value or a large frequency-division ratio with a charge transfer device having a small number of cells, so far no analog counter satisfying the demand has been provided.

One object of the present invention is to provide a counter which can achieve a counting operation or a frequency-dividing operation with a little delay.

Another object of the present invention is to provide a counter which can realize a large count value or a large frequency-division ratio with a small number of flip-flops or shift register stages.

Still another object of the present invention is to provide a counter that is effectively operable for an analog signal.

Yet another object of the present invention is to provide a novel counter that is available for both digital signal processing and analog signal processing.

A further object of the present invention is to provide a counter having a simple circuit construction.

A still further object of the present invention is to provide a counter which can handle multi-level logic.

Yet a further object of the present invention is to provide a counter which can realize a large frequency-division ratio by making use of a charge transfer device constructed of a small number of cells.

A still further object of the present invention is to provide a counter which can realize any frequency-division ratio including a prime number.

According to the present invention, a counter comprises a timing signal generator circuit, a hysteresis circuit and a control circuit. The timing signal generator circuit generates a timing signal at a predetermined time interval. A group of cascaded flip-flops, a shift register, a delay circuit such as a timer, etc. can be used to make the timing signal generator. Especially when employing a delay circuit, the timing for generating a timing signal can be easily controlled.

The hysteresis circuit has an output signal having a hysteresis characteristic, and that output signal is derived as an output signal of the counter. Preferably, this hysteresis circuit has its output controlled by an input having at least three logic levels (voltage levels or current levels) which are different from each other.

The control circuit is used for generating three or more signals having logic levels which are different from each other, which signals are to be input to the hysteresis circuit, as control signals. In the counter, the timing signal generator circuit (for instance, a delay circuit) is used for determining the input timing of a control signal (being output from the control circuit) which is input to the hysteresis circuit.

The hysteresis circuit has two output states at a high logic level $V_H$ and at a low logic level $V_L$. The switching between these output states is controlled by an input signal (in this instance, it being the aforementioned control signal). The most general hysteresis circuit is the Schmidt trigger circuit which has two input threshold levels (a low input threshold level $V_{INL}$ and a high input threshold level $V_{INH}$).

More particularly, in this hysteresis circuit, the output holds a low level $V_{OUTL}$ until the input signal exceeds the high input threshold level $V_{INH}$. Only after it has exceeded the high input threshold level, the output can be switched to a high level $V_{OUTH}$. Then, under the condition where the output is at the high level $V_{OUTH}$, this high level $V_{OUTH}$ is maintained until the level of the input signal becomes lower than the low input threshold level $V_{INL}$. Only after it has fallen lower than this level $V_{INL}$, the output can be switched to the low level $V_{OUTL}$. In other words, depending upon the history of the application of the input signal, different logic levels can be output in the input signal range between the levels $V_{INL}$ and $V_{INH}$.

The present invention achieves a timing control for the rise ($V_{OUTL} \rightarrow V_{OUTH}$) and the fall ($V_{OUTH} \rightarrow V_{OUTL}$) of the output of the hysteresis circuit by making use of the above-described operation principle and thereby effect counting operations and frequency-dividing operations of a counter. The timing control is controlled by the above-described delay circuit, and the switching of the output level is controlled by the aforementioned control circuit. As a result, taking the delay time of the delay circuit as a parameter, it becomes possible to achieve counting operations or frequency-dividing operations having a repetition cycle which is longer than the parameter.

According to the present invention, the varieties of the logic levels of the control signal output from the control circuit are dependent upon the operation characteristics of the hysteresis circuit. If three varieties of control signals are employed, the lowest level is selected to be lower than the low input threshold level $V_{INL}$. The highest level is selected to be higher than the high input threshold level $V_{INH}$. The intermediate level is set between the low and high input threshold levels $V_{INL}$ and $V_{INH}$. Then, by successively selecting these three control signals and applying them to the hysteresis circuit while employing the output of the delay circuit as a timing signal, a counter is provided with one repetition cycle which is equal to four times the delay time t, that is, equal to 4t.

If a shift register consisting of N stages is used as the delay circuit and a clock signal $\phi$ having a repetition frequency $f\phi$ is used as a shift control signal for the shift register, then a frequency-divided output having a repetition frequency of $f\phi/N\cdot 4$ is derived from the hysteresis circuit. That is, a frequency division ratio of $\frac{1}{4}N$ can be realized. Comparing with the conventional counter constructed of only a shift register which requires a shift register consisting of 4N stages in order to obtain a frequency division ratio of $\frac{1}{4}N$, a shift register having only $\frac{1}{4}$ times that number of stages can suffice, according to the present invention.

According to the present invention, a reduction in the size of a counter is facilitated, and also various causes of degradation in operating characteristics of a shift register (such as delay in transmission, wiring capacitances, etc.) can be effectively obviated. In addition, if the control circuit is modified so that it can generate a signal taking a plurality of levels located between the low and high input threshold levels $V_{INL}$ and $V_{INH}$, then the maximum count value or the frequency division ratio of the counter can be further increased. In other words, a counter can be constructed of a further reduced number of delay elements. Hence a counter output without an error can be provided. Moreover, since control with multi-level logic can be achieved in a simple manner, the counter according to the present invention is extremely effective, not only in the field of digital information processing, but also in the field of analog information processing.

It is to be noted that, according to the present invention, the delay circuit is provided to control the timing for applying a control signal to the hysteresis circuit. Either the timing for generating the control signal could be controlled by the output of the delay circuit or the control signal itself could be delayed by the delay circuit before it is applied to the hysteresis circuit. Moreover, in the latter case, if a loop is provided for feeding back the output of the delay circuit or the sum of the outputs of the delay circuit and the hysteresis circuit to the input portion of the delay circuit, the control would become very simple.

The above-mentioned and other objects, features and advantages of the present invention will become more apparent by reference to the following description of preferred embodiments of the invention taken in conjunction with the accompanying drawings, wherein.

Figure 5:
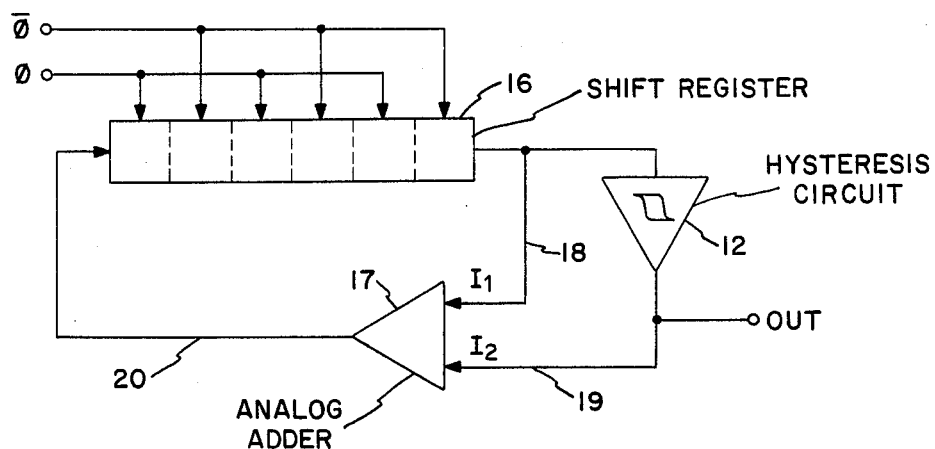
FIG. 5 is a block diagram of a counter according to a third preferred embodiment of the present invention.
Figure 6:
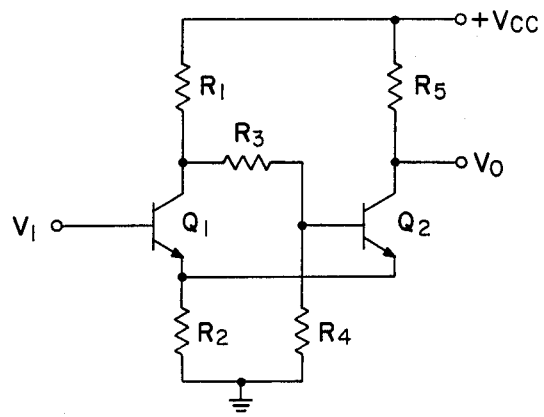
Figure 6:
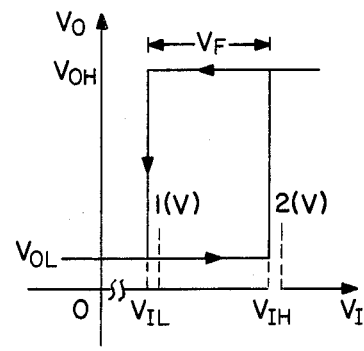
Figure 7:
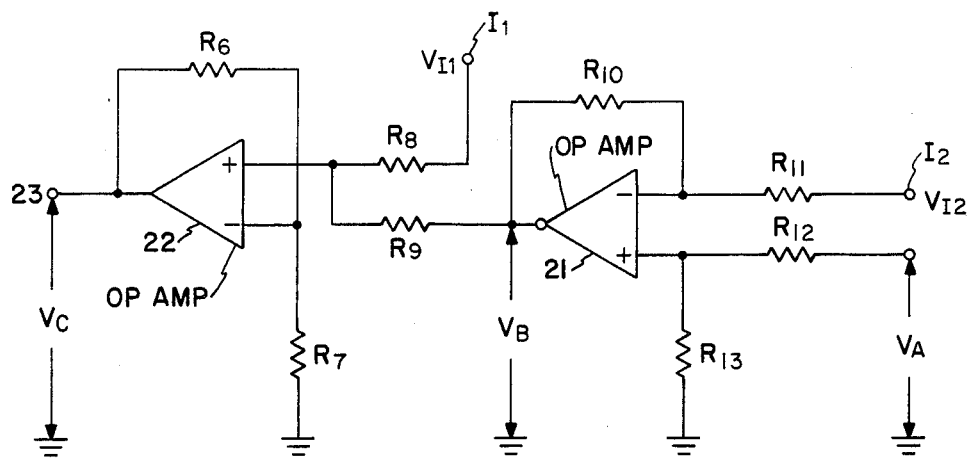
Figure 8:
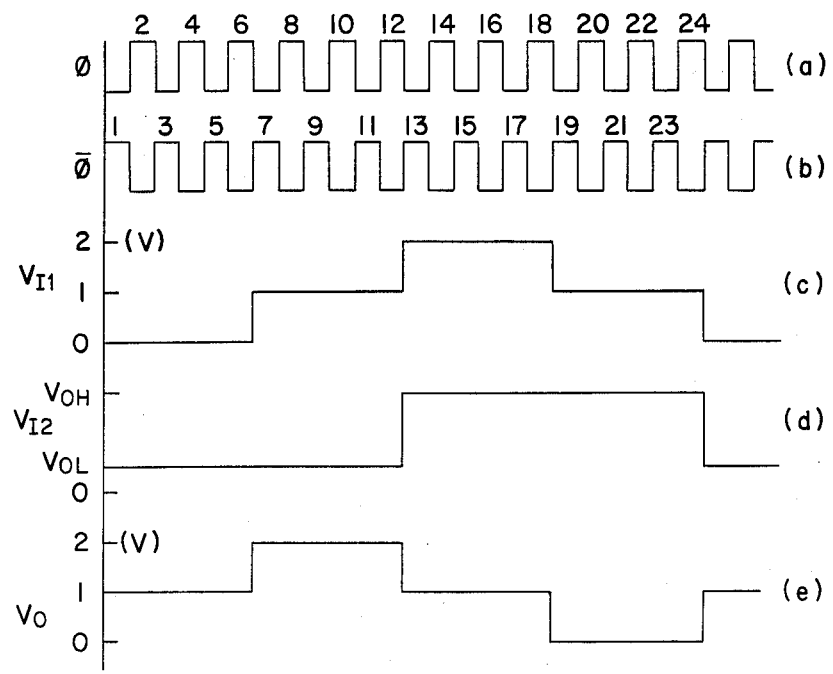
Figure 9:
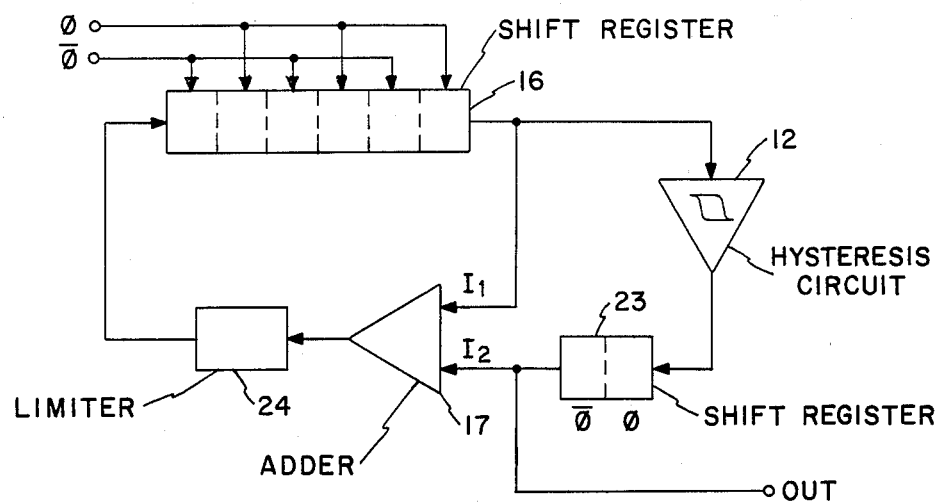
Figure 10:
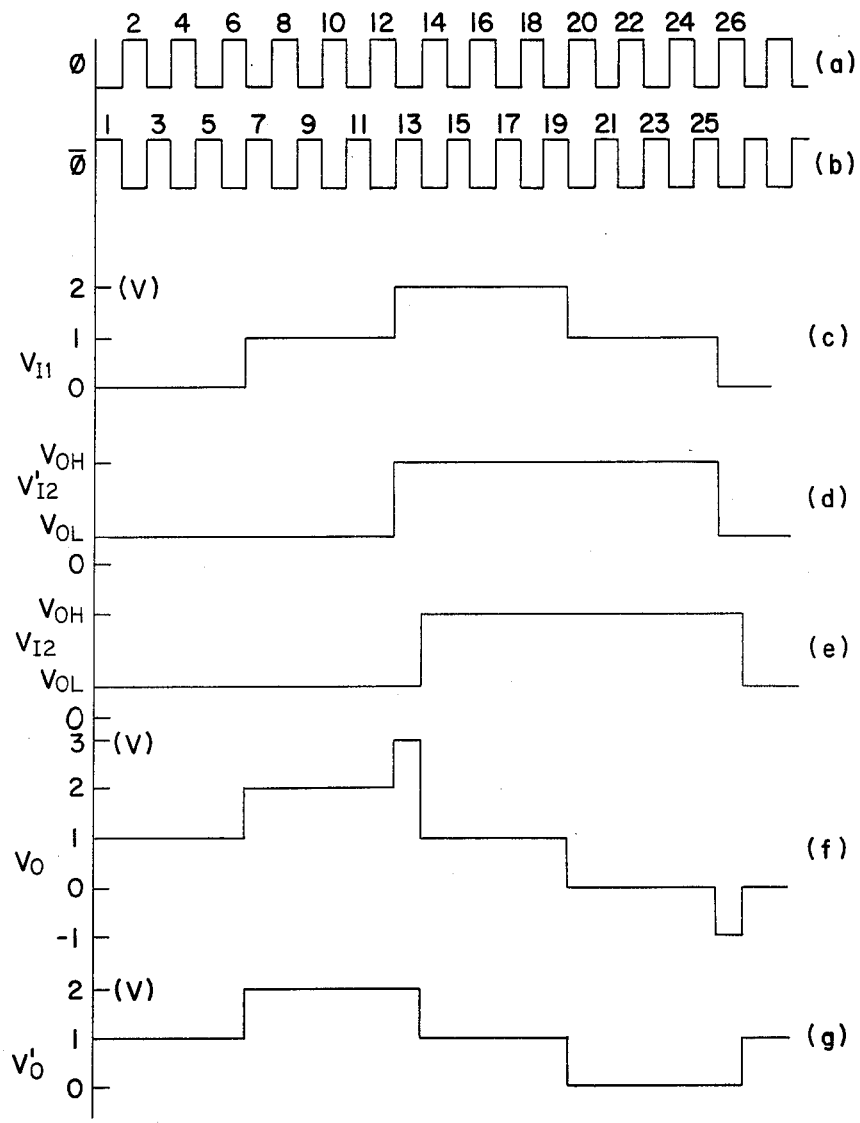
Figure 11A:
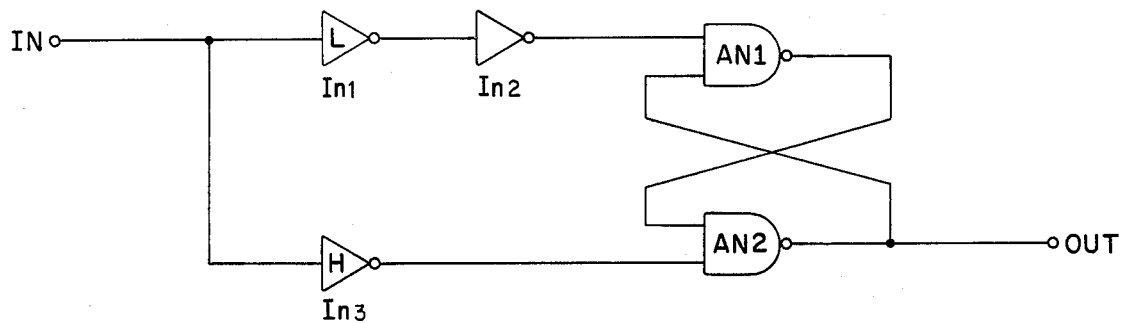
Figure 11B:
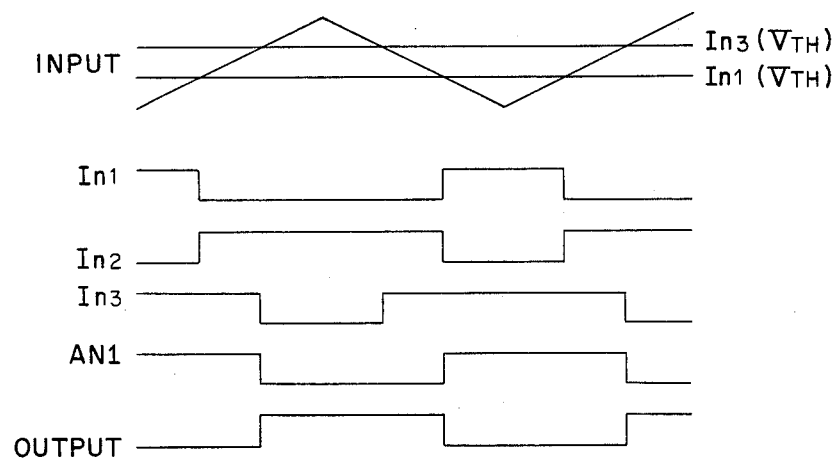
Figure 11C:
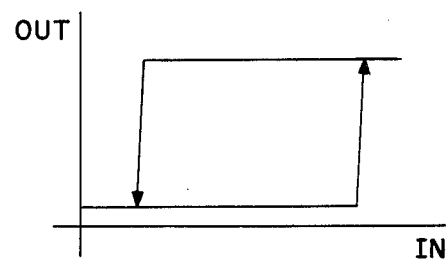
Figure 12:
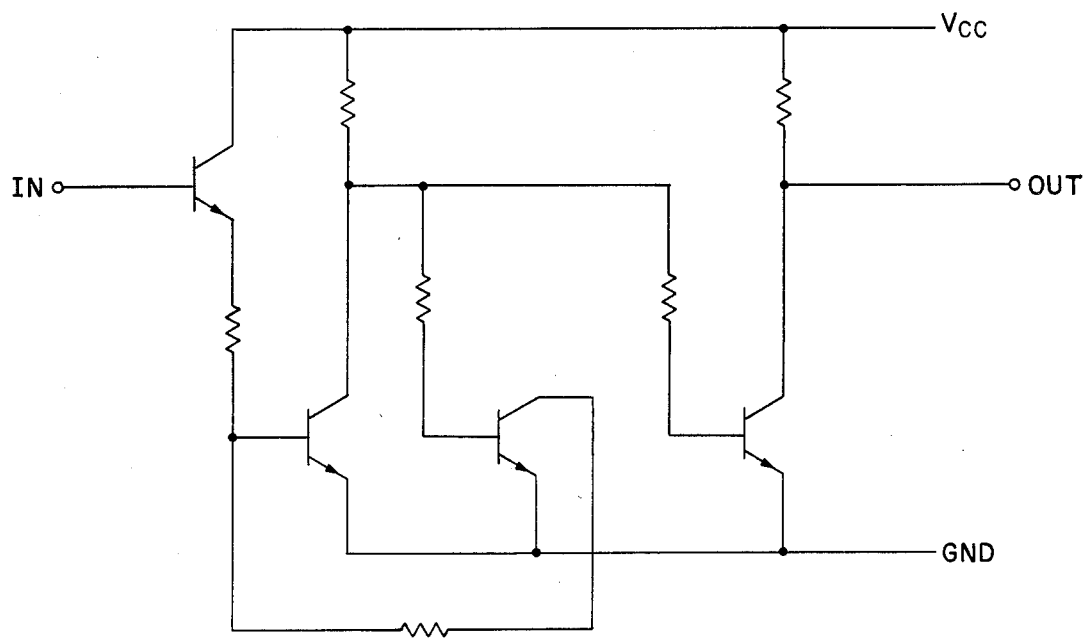
Figure 13:
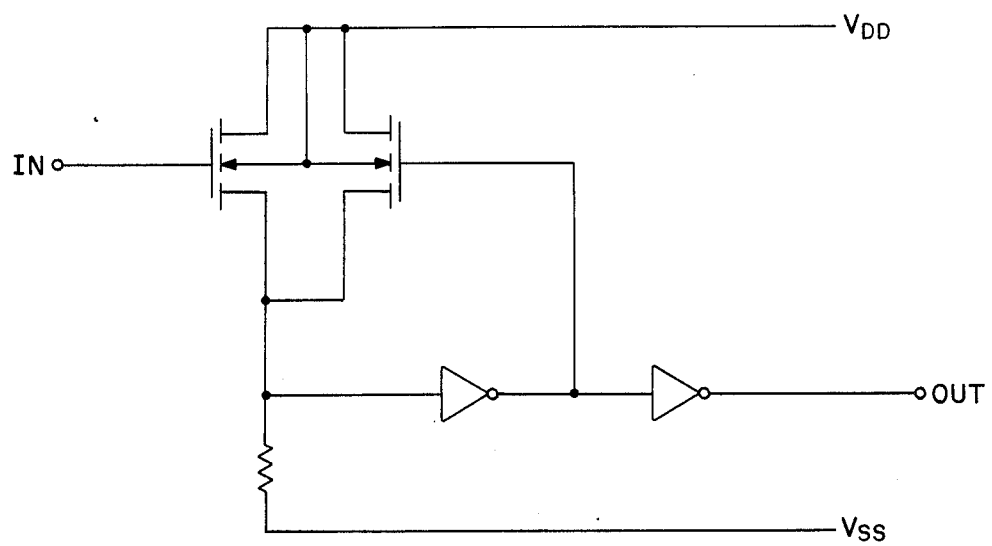

FIGS. 6(a) and 6(b), respectively, are a circuit diagram and a characteristic diagram of a Schmidt circuit which can be used as a hysteresis circuit in the counter according to the present invention;

FIG. 7 is a schematic circuit diagram of one example of an analog adder included in the counter shown in FIG. 5;

FIG. 8 is a time chart showing the mode of operation of the counter shown in FIG. 5;

FIG. 9 is a block diagram of a counter according to a fourth preferred embodiment of the present invention;

FIG. 10 is a time chart showing the mode of operation of the counter shown in FIG. 9;

FIGS. 11A to 11C are a hysteresis circuit, its timinng chart and its output signal waveform;

FIGS. 12 and 13 are examples of another hysteresis circuit.

Figure 1:
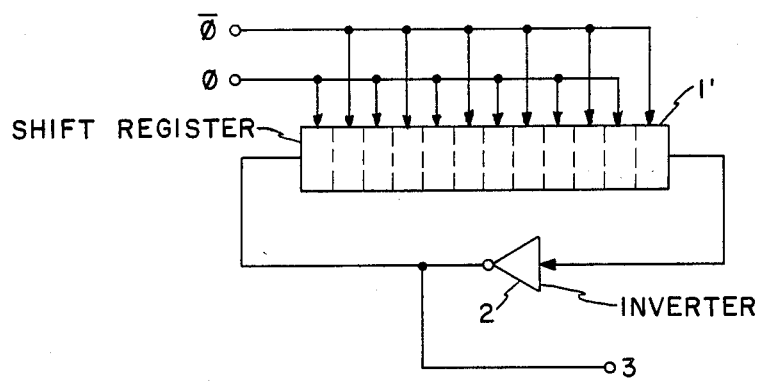
FIG. 1 is a block diagram of a counter employing a shift register in the prior art.

FIG. 1 shows a conventional counter making use of a shift register, in a block form. Reference numeral 1' designates a shift register consisting of $L_0$ stages (in the illustrated case, $L_0=12$). The numeral 2 designates an inverter for inverting the output of the shift register 1' and for applying the inverted signal to the input portion of the shift register 1'. The symbols $\phi$ and $\bar{\phi}$ designate clock pulses for shift control, and the numeral 3 designates an output terminal. Representing the number of shift stages of the shift register 1' by $L_0$ (a positive integer) and the number of phases of the clock pulses by P (in the illustrated case, P=2), the frequency division ratio $N_0$ of this counter is represented by the following equation:

$$N_0 = P/(2 \times L_0) \tag{1}$$

Hence, a frequency division ratio of 1/12 can be attained for the counter illustrated in FIG. 1.

If a counter is contemplated to produce a large frequency division ratio with the illustrated circuit construction, then the number of stages of the shift register must be increased further. Accordingly, a reduction in the size of a counter is impossible. Moreover, there is a serious shortcoming in performance because a transmission delay time (a delay in an output variation relative to an input variation) per unit stage of a shift register would accumulate. Hence the total transmission delay time becomes longer at the more backwardly placed stage, and thus an error in the frequency-division ratio becomes large. Still further, a stray capacitance is associated with the wiring for coupling the shift register, and as the wiring is increased the capacitance also increases, and the error becomes larger. In addition, even if a CCD is employed, the shortcoming is not resolved because in order to realize a large frequency division ratio, a CCD having a large number of cells must be used. In other words, even in the field of analog processing, the known counter cannot be an effective counter. Although it is also possible to achieve digital signal processing by means of a CCD, the use of a CCD provides no solution for the above-mentioned shortcomings.

Figure 2:
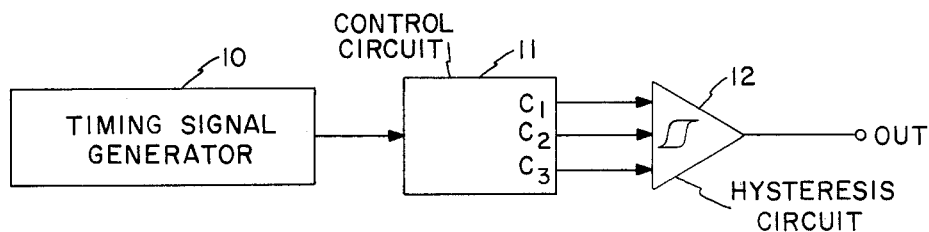
FIG. 2 is a block diagram of a counter according to a first preferred embodiment of the present invention.

A counter according to one preferred embodiment of the present invention is illustrated in a block form in FIG. 2. The illustrated counter consists of a timing signal generator circuit 10, a control circuit 11, and a hysteresis circuit 12. The timing signal generator circuit 10 generates a timing signal at a predetermined time interval t and applies it to the control circuit 11. The control circuit 11 detects the incoming timing signals which are sequentially applied thereto and successively generates three control signals $C_1$, $C_2$ and $C_3$ having different logic levels with respect to each other. The control signal $C_1$ is preset at a level which is lower than a low input threshold level $V_{INL}$ of the hysteresis circuit 12. The control signal $C_3$ is preset at a high level which is above high input threshold level $V_{INH}$ of the hysteresis circuit 12. In addition, the control signal $C_2$ is preset at an intermediate level which is between the levels $V_{INL}$ and $V_{INH}$. In the illustrated embodiment, the control circuit 11 is adapted to generate three different levels. However, as a matter of course, the illustrated embodiment could be modified to generate a plurality of levels located between the levels $V_{INL}$ and $V_{INH}$, as control signals.

In the counter shown in FIG. 2, in response to a first timing signal, the control signal $C_1$ is input to the hysteresis circuit 12. As a result, a low level signal $V_{OUTL}$ is output from the output portion OUT of the hysteresis circuit 12. In response to the next timing signal, the control signal $C_2$ is applied to the hysteresis circuit 12; however, under such conditions the output level of the hysteresis circuit 12 is held at the low level $V_{OUTL}$. Further, in response to the next subsequent timing signal, the control signal $C_3$ is output from the control circuit 11, and in response to this signal the output level of the hysteresis circuit 12 becomes the high level $V_{OUTH}$, for the first time. In response to the next timing signal, the control signal $C_2$ is again applied; however, the output level of the hysteresis circuit 12 is still held at the high level $V_{OUTH}$. Then in response to the next timing signal, the control signal $C_1$ is output and the output level of the hysteresis circuit 12 is changed to the low level $V_{OUTL}$. More particularly, as the control signal changes in the sequence of $C_1 \rightarrow C_2 \rightarrow C_3 \rightarrow C_2 \rightarrow C_1$, a frequency-divided output corresponding to one repetition period can be obtained at the output end of the hysteresis circuit 12. Subsequently, by repeating the above-described operation, a frequency-divided output can be obtained continuously. At this instance, the frequency division ratio relative to the repetition frequency $1/t$ of the timing signal is equal to $\frac{1}{4}$. As a matter of course, if a larger number of signals are generated corresponding to the control signal $C_2$ (every signal having a level between the levels $V_{INL}$ and $V_{INH}$), then a larger frequency division ratio can be realized.

Figure 3A:
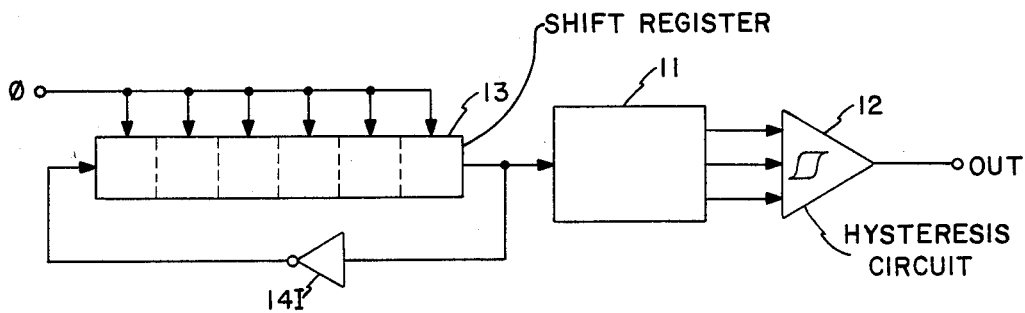
FIG. 3A is a block diagram showing the counter according to the first preferred embodiment in a more specific form.

FIG. 3 shows a more specific structure of the timing signal generator circuit 10 of FIG. 2. In this FIG. 3A circuit arrangement, a digital shift register 13, consisting of 6 stages, is used as the timing signal generator circuit 10, in the first preferred embodiment of the present invention. The shift operation of the shift register 13 is controlled by a single-phase clock $\phi$. An input signal to the shift register 13 is a signal obtained by inverting the output signal of the shift register 13 as it is fed back through an inverter 14I. The control circuit 11 and the hysteresis circuit 12 in the subsequent stages could be identical to those included in the circuit arrangement shown in FIG. 2. In this case, a frequency-divided output has a frequency division ratio which is determined by depending upon the delay time produced in the shift register 13. The divided frequency can be derived from the hysteresis circuit 12.

If the above-described circuit arrangement is employed, a timing signal generator circuit can be combined with a hysteresis circuit in a simple manner. Then, a frequency-divided output that is similar to that obtained from the circuit shown in FIG. 2, can be derived from the hysteresis circuit 12.

Figure 3B:
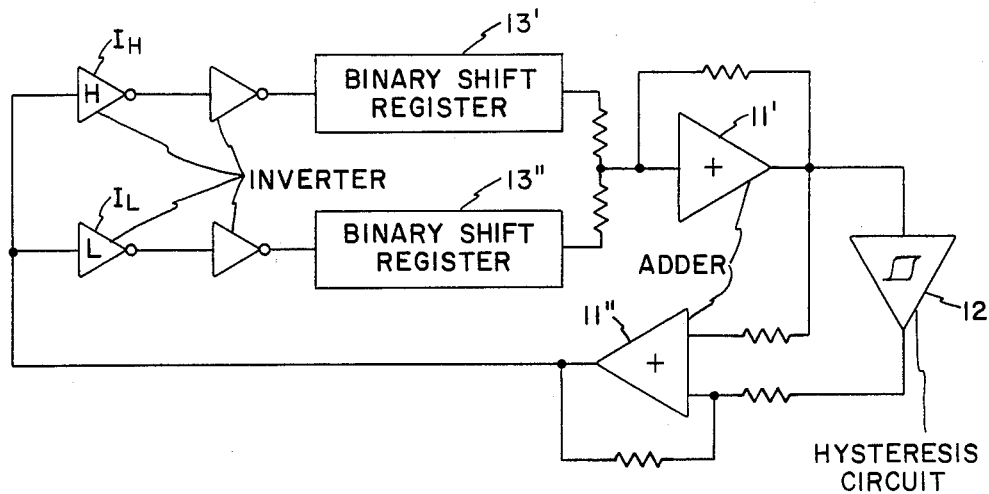
FIG. 3B is a more detail diagram of the counter shown in FIG. 3A.

FIG. 3B is a more detail circuit of a digital processing counter. There are two binary shift registers 13' and 13" of N stages. To an input portion of the shift register 13' is coupled an inverter $I_H$ with a high threshold level, and to an input portion of the shift-register 13" is coupled an inverter $I_L$ with low threshold level. An adder 11' is employed as a control circuit. Outputs of the two shift-registers 13' and 13" are applied to an input portion of the adder 11'. An output of the adder 11 is applied to the hysteresis circuit 12 and to an adder 11". This adder 11" is inserted in a feed back loop, and its output is applied in common to inverters $I_H$ and $I_L$. In this case, the shift-register 13" shifts a signal with a level which is above a high threshold level. On the other hand, the shift-register 13' shifts a signal with a level which is between a low threshold level and a high threshold level. Two output signals of shift-registers 13' and 13" are added to each other by the adder 11' and they control the hysteresis circuit 12 according to above description.

Figure 4:
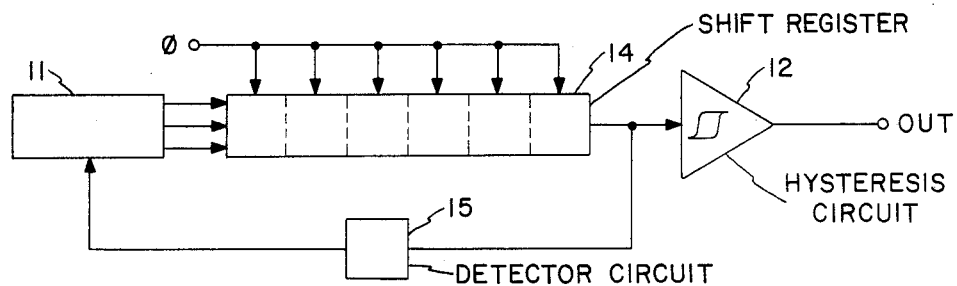
FIG. 4 is a block diagram of a counter according to a second preferred embodiment of the present invention.

FIG. 4 shows a second preferred embodiment of the present invention, in which a delay circuit is used as a timing signal generator circuit, which is similar to the circuit shown in FIG. 3. However, in this case, the delay circuit is formed by an analog shift register which is capable of delaying signals having different logic levels. In this preferred embodiment of the invention, a control circuit 11 is provided in the stage preceding to an analog shift register 14. The selection of the control signals is effected in response to an output signal from a detector circuit 15 which can detect variations of the output from the analog shift register 14. Then a frequency-divided output, that is similar to the outputs of the circuit arrangements shown in FIGS. 2 and 3, can be obtained from the output of the hysteresis circuit 12 in FIG. 4.

Especially in the case of the counter shown in FIG. 3 or 4, a large frequency division ratio can be realized with a small number of stages in the shift register, and hence an undesired delay-making error is reduced. It is to be noted that obviously a group of cascaded flip-flops could be used in place of the shift register in the circuit shown in FIG. 3 or 4.

A third preferred embodiment of the present invention is illustrated in a block form in FIG. 5. In this specific embodiment, for a timing signal generator circuit and a control circuit in combination, an analog shift register 16 consisting of a 6-stage CCD and an analog adder 17 having an output of the analog shift register 16 and an output of a hysteresis circuit 12 applied to its inputs are used. A connecting line 18 provides means for applying the output of the analog shift register 16 to the analog adder 17. A connecting line 19 provides means for applying the output of the hysteresis circuit 12 to the analog adder 17. Further, a connecting line 20 provides means for applying the output of the analog adder 17 to the analog shift register 16.

FIGS. 6(a) and 6(b), respectively, show a circuit diagram and a characteristic diagram of a Schmidt circuit, which can be one example of the hysteresis circuit 12 shown in FIGS. 4 and 5. In the case of a raising input signal voltage $V_I$, until it reaches a predetermined level $V_{IH}$ (called "high input threshold level"), an output voltage $V_O$ remains at a low level that is equal to a predetermined voltage $V_{OL}$. When the input signal voltage $V_I$ has reached the high input threshold level $V_{IH}$, the output voltage $V_O$ jumps to a high level that is equal to a predetermined voltage $V_{OH}$. For the input signal voltage $V_I$ exceeding this high input threshold level $V_{IH}$, this output voltage value $V_{OH}$ is maintained. Subsequently, in the case of a reduction of the input signal voltage $V_I$, even if it becomes lower than the high input threshold level $V_{IH}$, the output voltage $V_O$ continues to hold the high level $V_{OH}$. Only when the input signal voltage $V_I$ has reached a predetermined level $V_{IL}$ (called "low input threshold level") will the output voltage $V_O$ jump back to the initial low level $V_{OL}$ and subsequently maintains this low voltage value $V_{OL}$. A difference voltage $V_F$, between the high and low input threshold levels $V_{IH}$ and $V_{IL}$ as shown in FIG. 6(b), is a hysteresis width. In other words, a hysteresis circuit has the characteristic that it presents a bi-level output voltage consisting of a high level and a low level, responsive to an input signal voltage in the range between the high and low input threshold levels $V_{IH}$ and $V_{IL}$.

One example of a circuit arrangement for the analog adder 17 shown in FIG. 5 is illustrated in FIG. 7. In this figure, reference numerals 21 and 22 designate operational amplifiers respectively. Symbol $I_1$ designates an input terminal which receives the output voltage of the analog shift register 16. Symbol $I_2$ designates another input terminal which receives the output voltage of the hysteresis circuit 12. Numeral 23 designates an output terminal of the analog adder 17.

In the circuit associated with the operational amplifier 21, it is assumed that the resistances of the respective resistors fulfil the following relationships:

$$R_{11} = R_{12} \qquad (2)$$
$$R_{10} = R_{13}$$

$$\frac{R_{10}}{R_{11}} = \frac{2}{V_{OH} - V_{OL}} \cdot \frac{V_F}{M}$$

where M is a positive integer called a "division index". Furthermore, to the positive input terminal of the operational applifier 21, a fixed bias voltage $V_A$ is applied through resistors $R_{12}$ and $R_{13}$. Voltage $V_A$ is given by the following equation:

$$V_A = \frac{V_{OH} + V_{OL}}{2} \qquad (3)$$

Thus, an output voltage $V_B$ of the operational amplifier 21 takes either one of two alternative values represented by the following equations. The output voltage of amplifier 21 depends upon the output voltage of the hysteresis circuit 12 which is the input voltage $V_{I2}$ applied to the input terminal $I_2$ that may be either $V_{OL}$ or $V_{OH}$:

$$V_B = \frac{V_F}{M} \text{ (in the case of } V_{I2} = V_{OL}) \qquad (4)$$

or $$V_B = -\frac{V_F}{M} \text{ (in the case of } V_{I2} = V_{OH})$$

Assuming now that the resistances of the resistors associated with the operational amplifier 22 fulfil the equations $R_6 = R_7 = R_8 = R_9$, then an output voltage $V_c$ of the operational amplifier 22 is given by either one of the following equations:

$$V_C = V_{I1} + \frac{V_F}{M} \text{ (in the case of } V_{I2} = V_{OL}) \qquad (5)$$

or $$V_C = V_{I1} - \frac{V_F}{M} \text{ (in the case of } V_{I2} = V_{OH})$$

where $V_{I1}$ represents an input voltage which is applied from the output of the analog shift register 16 (FIG. 5) to the input terminal $I_1$.

Now a description will be made of the operation of the circuit shown in FIG. 5 acting as a counter, on the basis of the above-described basic knowledge, with reference to FIG. 8. For simplicity of explanation, it is assumed that the number of shift stages of the analog shift register is "6", a division index "M" for the hysteresis width $V_F$ of the hysteresis circuit 12 is "2", and the hysteresis width is $V_F=2(V)$. In addition, it is assumed that the analog shift register 16 has been initially reset to 0 (V). It is to be noted that, in order to make the circuit operations more stable, with regard to the division of the hysteresis width $V_F$, it is preferable to set the lower limit value of the input voltage $V_I$ slightly higher than the low input threshold level $V_{IL}$ and the upper limit value of the hysteresis width slightly higher than the high input threshold level $V_{IH}$.

A clock pulse train $\phi$ has a frequency which is to be divided and an inverted clock pulse train $\bar{\phi}$ of the same clock pulse period. These pulse trains are applied to the analog shift-register 16 as shown in FIG. 8, at (a) and (b), respectively, in FIG. 8. The output voltage $V_{I1}$ of the shift register 16 is held at 0 (V) for the time interval of 6 pulses in total of the clock pulses $\phi$ and $\bar{\phi}$ (See curve (c) in FIG. 8). The output voltage $V_{I2}$ of the hysteresis circuit 12 is held at $V_{OL}$ during that time interval (See curve (d) in FIG. 8). The output voltage $V_c$ of the adder is held at 1 (V) according to Equation-(5), above (See curve (e) in FIG. 8).

Subsequently when a seventh clock pulse (FIG. 8b) is applied to the analog shift register 16 (FIG. 5), the output voltage $V_{I1}$ of the shift register 16 changes to 1

(V), but the output voltage $V_{f2}$ of the hysteresis circuit 12 still remains at the low level $V_{OL}$. As a result, the output voltage $V_c$ of the adder 17 becomes 2 (V), and this state is sustained until the 12-th clock pulse. Subsequently, when the 13-th pulse is applied to the analog shift register 16, the output voltage $V_{f1}$ of the shift register register 16 changes to 2 (V). In response thereto the output voltage of the hysteresis circuit 12 jumps to the high level $V_{OH}$. As a result, the output voltage $V_c$ of the adder 17 becomes 1 (V) according to Equation-(5), and this state is sustained until the 18-th clock pulse. Subsequently, when the 19-th pulse is applied to the analog shift register 16, the output voltage $V_{f1}$ of the shift register 16 changes to 1 (V), but the output voltage $V_{f2}$ of the hysteresis circuit 12 still remains at the high level $V_{OH}$. Accordingly, the output voltage $V_c$ of the adder 17 becomes 0 (V), and this state is sustained until the 24-th clock pulse. Further subsequently, when the 25-th pulse is applied to the analog shift register 16, the output voltage $V_{f1}$ of the shift register 16 returns to 0 (V). Hence the output voltage $V_{f2}$ of the hysteresis circuit 12 also returns to the low level $V_{OL}$, and the output voltage $V_c$ of the adder 17 returns to 1 (V) which was the output voltage in the initial state. Therefore, by comparing the input clock pulse train $\phi$ (shown at (a) in FIG. 8) with the pulse appearing at the output terminal OUT (as shown at (d) in FIG. 8), it will be readily seen that the frequency-division ratio of the illustrated counter is 1/12.

The above-described relationship between the input pulse and the output pulse is not changed even if the number "L" of shift stages of the analog shift register 16, as well as the division index M for the hysteresis width $V_F$ of the hysteresis circuit 12, are increased. The frequency division ratio $N_1$ of the counter according to the preferred embodiment illustrated in FIG. 5 is generally given by the following equation:

$$N_1 = P/(2 \times L \times M) \tag{6}$$

Compare Equation-(6) with Equation-(1), which gives a frequency division ratio $N_0$ of the counter in the prior art, as described previously. It will be seen that for the same frequency division ratios $N_0$ and $N_1$, the following relationship is fulfilled.

$$L_0 = L \times M \tag{7}$$

This means that the number of shift stages of the analog shift register 16 to be used in the counter, according to the preferred embodiment illustrated in FIG. 5, could be as small as 1/M times the number of stages required in the heretofore known counter. In the illustrated example, the necessary number of shift stages is reduced by a factor of ½. Therefore, according to the preferred embodiment shown in FIG. 5, a counter having a large frequency division ratio can be easily realized by making use of a conventional analog shift register, whose number of stages is not so large.

It is to be noted that, in the counter according to the preferred embodiment shown in FIG. 5, the hysteresis circuit 12 is not limited to the circuit arrangement shown in FIG. 6(a). The analog adder 17 is not limited to the circuit arrangement shown in FIG. 7. In essence, it is only necessary for the output voltage $V_c$ of the analog adder 17 to fulfil the relationship of:

$$V_c = V_{f1} \pm V_O \tag{7}$$

depending upon whether the output voltage $V_{f2}$ of the hysteresis circuit 12 is at a low level ($V_{OL}$) or at a high level ($V_{OH}$). Other circuit arrangements could be employed for the hysteresis circuit 12, as well as the analog adder 17. In Equation-(7) above, $V_O$ represents a fixed voltage value. For instance, if a hysteresis circuit in which an output voltage takes $\pm V_O$ is used as the hysteresis circuit 12, then the input circuit for the analog adder 17 would become simpler because the fixed bias voltage $V_A$ becomes unnecessary.

Here, investigating the equation representing the frequency division ratio $N_1$ of the counter, according to the preferred embodiment of the present invention illustrated in FIG. 5, it will be readily seen that a prime number cannot be chosen as the frequency division ratio because the parameters P, L and M are positive integers. In other words, in the case where it is not necessary to select a prime number as the frequency division ratio, the counter according to the preferred embodiment shown in FIG. 5 is satisfactory. Moreover, the counter has a characteristic merit that it can be realized by a simple circuit arrangement. However, it involves the problem that a frequency division ratio of any number including a prime number can be not always realized.

FIG. 9 shows a counter, according to still another preferred embodiment of the present invention, which resolves the aforementioned problem of the embodiment shown in FIG. 5 and which makes it possible to realize any number of frequency division ratio. In FIG. 9, reference numeral 23 designates a shift register and reference numeral 24 designates a limiter circuit.

The only differences between the FIG. 9 counter and the counter shown in FIG. 5 resides in (a) the means for applying the output of the hysteresis circuit 12 to the analog adder 17 via the shift register 23, and (b) the means for applying the output of the analog adder 17 to the analog shift register 16 there is provided the limiter circuit 24. This shift register 23 could be any shift register having a number of shift stages X (a positive integer). It need not always be an analog shift register, it could even be a digital shift register. However, if a digital shift register is employed as the shift register 23, it is necessary to make provisions so that the output voltage $V_c$ of the adder 17 can be obtained according to Equation-(7), as per the logic operation. If the output voltage of the hysteresis circuit 12 is at the low level $V_{OL}$, it represents "1"; whereas if the output voltage is at the high level $V_{OH}$, it represents "0".

In addition, the limiter circuit 24 limits the output voltage of the adder 17 to a value which is within a certain predetermined range. The shift register 16 and the limiter circuit 24 can be easily constructed, by making use of prior art techniques.

Now, the operation of the above-described counter will be explained with reference to a time chart shown in FIG. 10. For simplicity of explanation, an analog shift register is employed as the shift register 23. The number of shift stages of the shift register 23 is assumed to be 2. The same clock pulse trains $\phi$ and $\bar{\phi}$, as those applied to the shift register 16, are applied to the shift register 23. In addition, it is assumed that the limiting voltage of the limiter circuit 24 is a voltage higher than +2(V) or lower than 0(V). The remainder of the circuit arrangement is identical to that according to the embodiment shown in FIG. 5.

In the time chart shown in FIG. 10, clock pulse trains $\phi$ and $\bar{\phi}$ are shown at (a) and (b), respectively. An output voltage $V_{f1}$ of the analog shift register 16 is shown at (c). The output voltage $V_{f2}$ of the hysteresis circuit 12 is shown at (d). An output voltage of the shift register 23, which serves as an input voltage $V_{f2}$ to a second input terminal $I_2$ of the adder 17, is shown at (e). An output voltage $V_c$ of the adder 17 is shown at (f), and an output voltage $V_c'$ of the limiter circuit 24 is shown at (g).

Here, let us compare this time chart of FIG. 10 with the time chart shown in FIG. 8. In the case of the embodiment shown in FIG. 9, owing to the insertion of the shift register 23, the true output voltage $V_{f2}'$ of the hysteresis circuit 12 is delayed by one clock pulse period in the shift register 23. Then it is applied to the adder 17. Accordingly, the apparent output voltage $V_{f2}$ of the hysteresis circuit 12 makes the jump of $V_{OL} \rightarrow V_{OH}$ of $V_{OH} \rightarrow V_{OL}$ with a delay of one clock pulse period (See FIG. 10 (e)). The output voltage $V_c$ of the adder 17 becomes $+3$ (V) in response to the 13-th clock pulse, and it becomes $-1$ (V) in response to the 26-th clock pulse (See FIG. 10 (f)). Therefore, this output voltage $V_c$ is limited to 0 (V)–2 (V) by means of the limiter circuit 24 (See FIG. 10 (g)). Then, it is applied to the input of the analog shift register 16, as an output voltage $V_c'$. Consequently, an output voltage $V_{f1}$ can be obtained as shown at (c) in FIG. 10. Comparing now the clock pulse train $\phi$ shown at (a) and the output pulse appearing at the output terminal OUT that is shown at (e), it is seen that the frequency division ratio of this counter is equal to 1/13. In other words, as compared to the frequency division ratio of 1/12 in the case of the embodiment shown in FIG. 5, the denominator of the frequency division ratio has been increased by one, and thus a frequency division ratio having a denominator of a prime number ("13") has been realized.

The frequency division ratio $N_2$ in the case of the embodiment shown in FIG. 9 is generally represented by the following equation:

$$N_2 = \frac{P}{(2 \times L \times M) + X} \quad (8)$$

where: L represents a number of shift stages of the analog shift register 16, and M represents a division index. X represents a number of shift stages X of the shift register 23, in addition to the parameters P, L and M. The desired frequency division ratio includes a reciprocal of a prime number.

The output terminal OUT of the counter was provided at the output of the hysteresis circuit 12 or the shift register 23 in the preferred embodiments shown in FIGS. 5 and 9. However the output terminal is not limited to such a location. By adding an appropriate circuit such as a waveform shaper circuit, for example, the output of the analog shift register 16 can be used as the output terminal OUT of the counter.

Moreover, the preferred embodiments in FIGS. 5 and 9 show what is essential. Two voltages are applied to the analog adder 17. One of them is the direct output voltage $V_{f1}$ of the analog shift register 16. The other is the output voltage $V_{f2}$ which is obtained by passing the output voltage $V_{f1}$ through the hysteresis circuit 12 and then delaying it by a predetermined period (including 0). These direct and delayed voltages $V_{f1}$ and $V_{f2}$ are added together by the analog adder 17 to obtain the output voltage $V_c$ having the following relationship:

$$V_c = V_{f1} \pm V_O \quad (9)$$

Hence, it is a matter of course that the aforementioned counter can be realized by employing any other appropriate circuit arrangement.

Furthermore, while a CCD was used as the analog shift register in the above explanation, another type of shift register such as a BBD, of course, could be employed.

As described in detail above, the counter according to the present invention makes use of a hysteresis circuit in addition to a heretofore used analog shift register, for the purpose of frequency division. A counter having a large frequency division ratio was difficult to realize in the prior art due to necessity of an analog shift register having a large number of stages. Such a large ratio counter can be easily provided in practice by making use of a conventional analog shift register whose number of stages is not as large. Therefore, the effects and advantages of the present invention are remarkable.

Now, another type of the hysteresis circuit is shown in FIG. 11A. FIG. 11B and FIG. 11C are an operating timing chart and an output timing chart. This hysteresis circuit has inverters $I_{n1}$, $I_{n2}$ and $I_{n3}$ and AND gates ($AN_1$ and $AN_2$) constructed to act as a flip-flop type between an input portion and an output portion. The inverter $I_{n1}$ has a low threshold level, and the inverter $I_{n3}$ has a high threshold level. When an input signal, which sequentially changes between a level under the low threshold level and a level over the high threshold level, is applied to the input portion, the outputs of the inverters, $I_{n1}$, $I_{n2}$ and $I_{n3}$ change as shown in FIG. 11B. Therefore, AND gates $AN_1$ and $AN_2$ output signals are as shown in FIG. 11B. The output of the hysteresis circuit of FIG. 11A is shown in FIG. 11C. This type circuit is effective in MOS LSI circuit design.

FIG. 12 shows a hysteresis circuit constructed by bipolar transistors and resistors. FIG. 13 shows a hysteresis circuit constructed by MOS transistors and a resistor. These hysteresis circuits can be adapted to FIGS. 2 to 5 and can be fabricated by using LSI technique.

What is claimed is:

1. A counter comprising timing signal generator circuit means for generating first to fifth timing signals at predetermined time intervals, hysteresis circuit means having an input-output characteristic which presents a hysteresis characteristic defined by a low input threshold level and a high input threshold level, control signal generating circuit means coupled to said timing signal generator circuit means for sequentially generating a first control signal having a voltage level which is lower than said low input threshold level in response to said first timing signal, a second control signal having a voltage level which is between said low input threshold level and said high input threshold level in response to said second timing signal subsequent to said first timing signal, a third control signal having a voltage level which is higher than said high input threshold level in response to said third timing signal subsequent to said second timing signal, and thereafter sequentially generating the second control signal in response to said fourth timing signal subsequent to said third timing signal, and sequentially generating the first control signal in response to said fifth timing signal subsequent to said fourth timing signal, means for applying the output of said control signal generator input means to said hysteresis circuit means, and output means for repeatedly taking an output signal in response to said second to said third control signal transistions and to said second to said first control signal transitions respectively.

2. A counter comprising delay circuit shift register means for delaying input signals and outputting the delayed signals, control circuit means coupled to an output portion of said delay circuit for successively generating control signals having at least three different logic levels in response to predetermined combinations of said delayed signals, hysteresis output circuit means responsive to said control signals for determining its output state depending upon the logic level of at least two of said control signals, and circuit feedback means for deriving an output signal from said hysteresis circuit and said control circuit for controlling said delay circuit.

3. The counter of claim 2 wherein said output circuit has a high output and a low output, and means for holding said high or said low outputs, respectively, until after the input signal rises above or falls below predetermined reference levels.

4. The counter of claim 3 wherein said feedback means includes inverter means for delaying said output pulse.

5. The counter of claim 2 wherein said feedback means includes inverter means for delaying said output pulse.

6. The counter of claim 5 in which there are two of said shift registers, means responsive to one of said shift registers for controlling the duration of a high level of said output signal, and means responsive to the other of said shift registers for controlling the duration of a low level of said output signal.

7. A counter comprising analog shift register means for shifting signals having at least three different logic levels, hysteresis circuit means controlled by an output of said analog shift register, threshold responsive logic means for receiving the outputs of said analog shift register and said hysteresis circuit, and means for applying the output of said logic means to an input of said analog shift register.

8. The counter of claim 7 in which said logic means includes an analog adder.

* * * * *